United States Patent [19]

Druminski

[11] 3,941,647

[45] Mar. 2, 1976

[54] METHOD OF PRODUCING EPITAXIALLY SEMICONDUCTOR LAYERS

[75] Inventor: Manfred Druminski, Vaterstetten, Germany

[73] Assignee: Siemens Aktiengesellschaft, Berlin & Munich, Germany

[22] Filed: Mar. 8, 1973

[21] Appl. No.: 339,216

[52] U.S. Cl. .............................. 156/612; 156/613
[51] Int. Cl.² ........................................ B44D 1/18
[58] Field of Search ....... 117/106 A, 201, 215, 213; 148/175

[56] References Cited
UNITED STATES PATENTS

| | | | |
|---|---|---|---|
| 3,139,361 | 6/1964 | Rasmanis | 117/106 A X |
| 3,177,100 | 4/1965 | Mayer et al. | 117/106 A X |
| 3,192,083 | 6/1965 | Sirtl | 117/217 X |
| 3,212,922 | 10/1965 | Sirtl | 117/106 A |
| 3,445,300 | 5/1969 | Sirtl | 117/106 A X |
| 3,484,311 | 12/1969 | Benzing | 117/106 A X |
| 3,508,962 | 4/1970 | Manasevit et al. | 117/106 A X |
| 3,511,702 | 5/1970 | Jackson, Jr. et al. | 117/212 |
| 3,653,991 | 4/1972 | Sirtl et al. | 148/175 |
| 3,698,944 | 10/1972 | Dyer | 117/201 |

FOREIGN PATENTS OR APPLICATIONS 1,619,980    1/1971    Germany .................. 117/106 A

OTHER PUBLICATIONS

Filby et al. Single-crystal films of silicon on insulators In Brit. J. Appl. Phys. 18: pp. 1357 to 1382, 1967.
Hart et al. Electrical properties of epitaxial silicon films on $\alpha$-alumina In Brit. J. Appl. Phys. 18: pp. 1389 to 1398, 1967.
Reisman et al. The Chemical Polishing of Sapphire and MgAl Spinel In J. Electrochem. Soc.:Solid State Science. 118(10): pp. 1653-1657. Oct. 1971.

Primary Examiner—Cameron K. Weiffenbach
Attorney, Agent, or Firm—Hill, Gross, Simpson, Van Santen, Steadman, Chiara & Simpson

[57] ABSTRACT

Method of producing epitaxially deposited layers of semiconductor material on a substrate by thermal decomposition of a gaseous compound of a select semiconductor material and depositing a seed layer of such semiconductor on the substrate and then adding a hydrogen halide to the gaseous compound and depositing additional semiconductor material on the seed layer.

12 Claims, 2 Drawing Figures 3,941,647

METHOD OF PRODUCING EPITAXIALLY SEMICONDUCTOR LAYERS

BACKGROUND OF THE INVENTION

1. Field of the Invention

The invention relates to production of epitaxially desposited semiconductor layers on a substrate and more particularly to the production of an extremely uniform epitaxially deposited semiconductor layer on a substrate.

2. Prior Art

Processes for producing epitaxially deposited layers of semiconductor materials on a substrate are known. For example, such a known process is described in German Offenlegungsschrift No. 1,619,980. Generally, this process first deposits a seed layer of a semiconductor material by thermally decomposing, for example, silane from a gas consisting of silane and hydrogen. Subsequently, further semiconductor material is deposited on a seed layer by thermal decomposition of a halide of the semiconductor material. However, non-uniformity is present between the so-deposited layers.

SUMMARY OF THE INVENTION

The invention provides a process of producing uniform epitaxially deposited layers of semiconductor material, such as silicon or germanium, on a substrate, such as sapphire or a Mg-Al spinel.

A novel feature of the invention comprises first depositing a seed layer of a semiconductor material on a substrate by thermal irreversible decomposition of a reaction gas containing a gaseous compound of the semiconductor material and then adding a hydrogen halide to the reaction gas and depositing further semiconductor material on the seed layer.

DESCRIPTION OF PREFERRED EMBODIMENTS

Figure 1:
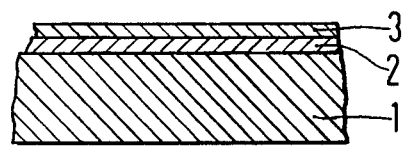
FIG. 1 is a partial cross-sectional view of a substrate with semiconductor layers deposited thereon by a process in accordance with the principles of the invention.

The invention generally comprises a simple process for producing uniform epitaxially deposited layers of a semiconductor material on a substrate. The process comprises first depositing a seed layer of a semiconductor material on a substrate by thermal irreversible decomposition of a reaction gas containing a gaseous compound of desired semiconductor material and then adding hydrogen halide to the reaction gas and depositing further semiconductor material on the seed layer.

With the process of the invention, the second step avoids the use of a halide of the semiconductor material, such as suggested in the known process referred to above. Instead, one merely adds a hydrogen halide to the reaction gas employed during the first step for depositing the seed layer. A preferred reaction gas is composed of a thermally decomposable gaseous silicon or germanium compound, for example, selected from the group consisting of $SiH_4$ and $GeH_4$ and an inert gas, for example, selected from the group consisting of hydrogen and helium. When deposition of silicon, for example, is desired, a preferred reaction gas consists of a mixture of about 1% to 3% silane ($SiH_4$) in hydrogen and hydrogen. Another preferred reaction gas for the deposition of silicon consists of a mixture of about 1% to 3% silane in helium and helium. Similarly, when deposition of germanium is desired, a reaction gas is comprised of a mixture of germanium tetrahydride ($GeH_4$) in an inert gas selected from the group consisting of hydrogen and helium and such inert gas. The gaseous hydrogen halide utilized in the practice of the invention is preferably selected from the group consisting of hydrogen chloride (HCl) and hydrogen bromide (HBr).

One advantage of the process of the invention is that only a single gaseous semiconductor material is required for deposition of a semiconductor material during both the first step, during which the irreversible decomposition and deposition take place and in the second step, during which deposition proceeds in accordance with an equilibrium reaction. Thus, there is a continuous transition from the first to the second step, which yields a more homogeneous crystal structure in the epitaxially deposited semiconductor layers than attainable with known processes.

During the formation of the seed layer there is a relatively high growth rate and during the further deposition of semiconductor material on the seed layer, there is a relatively lower growth rate. The lower growth rate is controllable by a controlled addition of hydrogen halide to a constant supply of a reaction gas that includes the semiconductor compound to be decomposed, for example, silane. The constant supply of reaction gas is maintained during both deposition steps. The addition of hydrogen halide influences the chemical equilibrium reaction which takes place during the second step and leads, respectively, to the deposition of semiconductor materials and removal of previously deposited materials.

With the aid of the equilibrium reaction that takes place during the second step, incorrectly or poorly incorporated lattice atoms of the semiconductor layer are disassembled and replaced in a better manner by new depositions of semiconductor material.

Referring to FIG. 1, a substrate 1, preferably composed of a Mg-Al spinel or sapphire has a seed layer 2 and a subsequent layer 3 thereon, both of a select semiconductor material, such as silicon or germanium. The seed layer 2 is deposited on a surface of the substrate by the irreversible, thermal decomposition of a reaction gas, which in one preferred embodiment consists of a mixture of silane and hydrogen. Subsequently, a hydrogen halide, preferably hydrogen chloride or hydrogen bromide, is added to the reaction gas and layer 3 is formed as a result of a chemical equilibrium reaction.

The process of the invention is preferably carried out as follows. Substrate wafers, which have previously been cut and polished along specific crystal planes, are initially freed of damaged layers. Preferably, this is effected by annealing the substrate wafers at a temperature of more than 1000° C. in a hydrogen atmosphere or by chemically wet-etching the wafers at elevated temperatures, preferably with phosphoric acid at temperatures between 200° to 400° C. The treated substrate wafers are then preferably placed in a water-cooled quartz reaction housing on an inductively heated, high-purity carbon plate. The housing is flushed out with hydrogen or an inert gas and then the carbon plate and wafer are heated up to at least the decomposition temperature of a select gaseous semiconductor compound, while continuing to flush the housing. Preferably, when hydrogen is the gas being passed through the housing, the wafer is heated above the decomposition temperature and to a temperature above about 1000° C. and when an inert gas, such as helium is being passed through the housing, the wafer is heated above the decomposition temperature of a select compound and to a temperature below about 1000° C., and preferably in the range of about 850° to 980° C. A suitable gaseous semiconductor compound, such as silane, is then added to the continuous stream of hydrogen or inert gas, as by opening appropriate valves between a silane supply and an inert gas supply. In embodiments where the quartz housing has a rectangular chamber with a cross-sectional area of approximately 20 cm$^2$, about 2000 to 4000 l/h of hydrogen and about 500 to 1500 l/h of a mixture of 1% to 3% silane in hydrogen are preferably utilized to form the reaction gas. The silane is supplied until a continuous seed layer forms on the substrate wafer. Preferably, the silane is supplied until the seed layer attains a thickness of about 0.05 to 0.3$\mu$. In the second step which now follows, a hydrogen halide, such as hydrogen chloride, is supplied to the reaction housing, without the silane and hydrogen flow or the temperature being altered. For the above housing having a cross-sectional area of about 20 cm$^2$, preferably about 5 to 150 l/h of hydrogen chloride is utilized. The addition of hydrogen chloride causes a chemical equilibrium reaction to occur and, consequently, the growth rate of layer 3 is less than the growth layer of layer 2. Hydrogen bromide may be utilized to replace hydrogen chloride.

Figure 2:
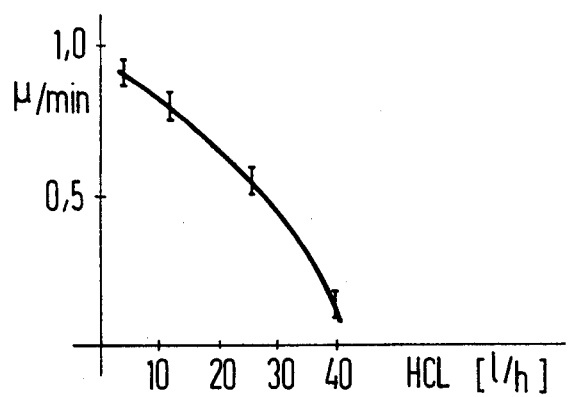
FIG. 2 is a graph illustrating the growth rate of semiconductor material in relation to hydrogen chloride concentration in a reaction gas during the second step of a process in accordance with the principles of the invention.

FIG. 2 illustrates the dependency of the growth rate of a growig silicon semiconductor layer from a constant volume of silane and hydrogen in relation to hydrogen chloride, when 1100 l/h of a mixture of 1% silane in hydrogen and 4000 l/h of hydrogen are fed to a quartz reaction housing having a cross-sectional area of about 20 cm$^2$. From the illustrated curve, a desired growth rate may be determined as a function of hydrogen chloride addition during the second step.

When a desired layer thickness is attained, the silane, hydrogen and hydrogen chloride streams are shut off and the heating of the wafer with the semiconductor material deposited thereon is terminated.

Germanium may be deposited on a substrate in a somewhat similar manner. In this case, the deposition of the seed layer on a substrate is effected by the irreversible thermal decomposition of a reaction gas containing a suitable gaseous germanium compound, such as GeH$_4$, along with hydrogen or an inert gas. The wafer is heated at least to the decomposition temperature of the germanium compound and, when hydrogen is included in the reaction gas, the wafer is heated to a temperature of about 600° to 850° C. so as to deposit a seed layer of germanium on the substrate. The subsequent deposition of germanium preferably takes place at the same termperatures, again making use of equilibrium reaction which occurs after the addition of a hydrogen halide to the reaction gas.

Although particular embodiments of the invention have been described and illustrated herein, it is recognized that modifications and variations may readily occur to those skilled in the art and consequently it is intended that the claims be interpreted to cover such modifications and equivalents.

I claim as my invention:

1. A process of producing an epitaxially deposited semiconductor layer uniformly composed of a material selected from the group consisting of silicon and germanium onto a substrate composed of a material selected from the group consisting of sapphire and a Mg-Al spinel, comprising the sequential steps of:
   preparing a wafer of said substrate for expitaxial deposition by cutting, polishing along specific crystal planes and freeing said wafer of damaged layers;
   placing the prepared wafer in an enclosed chamber on an inductively heated support means, flushing said chamber with an inert gas and heating said wafer up to at least the decomposition temperature of a thermally decomposable gaseous compound selected from the group consisting of SiH$_4$ and GeH$_4$;
   passing a stream of a reaction gas composed of a mixture of an inert gas and said thermally decomposable gaseous compound in an inert gas, said inert gas being selected from the group consisting of hydrogen and helium, through said chamber while maintaining said temperature of said wafer for a period of time sufficient to relatively quickly deposit a continuous seed layer of said material onto at least one surface of said wafer; and
   substantially simultaneously maintaining said stream of said reaction gas about said wafer and maintaining said temperature of said wafer while adding only a gaseous hydrogen halide selected from the group consisting of hydrogen chloride and hydrogen bromide to said stream of reaction gas for a period of time sufficient to relatively slowly deposit a further layer of said material onto said seed layer.

2. A process for producing an epitaxially deposited layer uniformly composed of a material selected from the group consisting of silicon and germanium onto a substrate composed of a material selected from the group consisting of sapphire and a Mg-Al spinel comprising the sequential steps of:
   placing said substrate in a reaction gas composed of a select mixture of an inert carrier gas and a thermally decomposable gaseous compound selected from the group consisting of SiH$_4$ and GeH$_4$;
   heating said substrate to at least the decomposition temperature of said thermally decomposable gaseous compound for a period of time sufficient to deposit a continuous seed layer of said material onto at least one surface of said substrate; and
   substantially simultaneously maintaining said select mixture of inert gas and decomposable gaseous compound about said substrate and maintaining said temperature of said substrate while adding only a gaseous hydrogen halide selected from the group consisting of HCl and HBr to said reaction gas whereby additional amounts of said material are deposited on said seed layer.

3. A process as defined in claim 2 wherein the substrate is chemically wet-etched at temperatures in the range of about 200° to 400° C. with phosphoric acid prior to being placed in the reaction gas atmosphere.

4. A process as defined in claim 2 wherein the reaction gas consists of a mixture of hydrogen and about 1% to 3% silane in hydrogen.

5. A process as defined in claim 2 wherein the reaction gas consists of a mixture of silane and an inert gas and the substrate is heated to a temperature below 1000° C. so as to deposit silicon on said substrate.

6. A process as defined in claim 2 wherein the reaction gas consists of a mixture of helium and about 1% to 3% silane in helium.

7. A process as defined in claim 2 wherein the substrate is heated to a temperature in the range of about 850° to 980° C.

8. A process as defined in claim 2 wherein the reaction gas atmosphere consists of a mixture of $GeH_4$ and a gas selected from the group consisting of hydrogen and an inert gas and the substrate is heated to a temperature of about 600° to 850° C. so as to deposit germanium on said substrate.

9. A process as defined in claim 2 wherein the hydrogen halide is hydrogen chloride.

10. A process as defined in claim 2 wherein the hydrogen halide is hydrogen bromide.

11. An epitaxially deposited semiconductor layer produced by a process as defined in claim 2.

12. A process as defined in claim 2 wherein the reaction gas consists of a mixture of $GeH_4$ and in inert gas and the substrate is heated to a temperature in the range of about 600° to 850° C.

* * * * *